(12) United States Patent
Nagamatsu et al.

(10) Patent No.: US 9,307,630 B2
(45) Date of Patent: Apr. 5, 2016

(54) DEVICE MOUNTING BOARD, CELL, AND BATTERY MODULE (71) Applicant: SANYO ELECTRIC CO., LTD., Moriguchi-shi, Osaka (JP)

(72) Inventors: Masayuki Nagamatsu, Mizuho (JP); Mayumi Nakasato, Ogaki (JP); Yasuyuki Yanase, Hashima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 153 days.

(21) Appl. No.: 13/768,777

(22) Filed: Feb. 15, 2013

(65) Prior Publication Data

US 2013/0157102 A1 Jun. 20, 2013

Related U.S. Application Data (63) Continuation of application No. PCT/JP2012/001184, filed on Feb. 22, 2012.

(30) Foreign Application Priority Data

Mar. 31, 2011 (JP) ................. 2011-080205

(51) Int. Cl.
| | |
|---|---|
| H01M 10/50 | (2006.01) |
| H05K 1/02 | (2006.01) |
| H05K 1/05 | (2006.01) |
| H01M 2/10 | (2006.01) |
| H01M 10/653 | (2014.01) |
| H01M 10/6554 | (2014.01) |
| H01M 10/617 | (2014.01) |

(52) U.S. Cl.
CPC ........... *H05K 1/0203* (2013.01); *H01M 2/1077* (2013.01); *H01M 2/1094* (2013.01); *H01M 10/617* (2015.04); *H01M 10/653* (2015.04); *H01M 10/6554* (2015.04); *H05K 1/053* (2013.01); *H05K 1/056* (2013.01); *H05K 2201/0116* (2013.01); *H05K 2201/10037* (2013.01); *H05K 2201/10166* (2013.01); *H05K 2203/0315* (2013.01)

(58) Field of Classification Search
CPC . H01M 2/1077; H01M 2/1094; H01M 10/50; H01M 10/5008; H01M 10/504; H01M 10/5053; H05K 1/0203; H05K 1/056; H05K 1/053; H05K 2201/0116; H05K 2201/10037; H05K 2201/10166; H05K 2203/0315
See application file for complete search history.

(56) References Cited

FOREIGN PATENT DOCUMENTS

| | | | |
|---|---|---|---|
| JP | 02-185993 | 7/1990 | |
| JP | 06-334287 | * 2/1994 | ............... H05K 1/05 |
| JP | 06-334287 | 12/1994 | |

(Continued)

OTHER PUBLICATIONS

International Search Report issued in Int'l Application No. PCT/JP2012/001184 dated May 29, 2012.

*Primary Examiner* — Raymond Alejandro (74) *Attorney, Agent, or Firm* — McDermott Will & Emery LLP (57) ABSTRACT

A device mounting board comprises: a heat dissipating substrate formed of a material containing at least one metal material selected from a group including Al, Mg, and Ti; an insulting resin layer laminated on the heat dissipating substrate; and a wiring layer laminated on the insulating resin layer, and on which a power module is to be mounted. The heat dissipating substrate comprises a random porous layer arranged such that it faces the insulating resin layer, and having cavities elongated in respective random directions.

5 Claims, 11 Drawing Sheets

(56) References Cited

FOREIGN PATENT DOCUMENTS

| JP | 2000-106215 A | 4/2000 |
| JP | 2004-179224 A | 6/2004 |
| JP | 2006-024906 A | 1/2006 |
| JP | 2008-226744 A | 9/2008 |
| JP | 2010-518258 A | 5/2010 |
| WO | 2008099014 A1 | 8/2008 |

\* cited by examiner

DEVICE MOUNTING BOARD, CELL, AND BATTERY MODULE

CROSS REFERENCE TO RELATED APPLICATIONS

This application is a Continuation of PCT/JP2012/001184, filed on Feb. 22, 2012, which claims priority of Japanese Patent Application No. 2011-080205, filed on Mar. 31, 2011, the disclosures of which applications are incorporated herein by reference.

BACKGROUND OF THE INVENTION

1. Field of the Invention

The present invention relates to a technique for a heat dissipating substrate for elements.

2. Description of the Related Art

Thus far, development of power modules such as IGBTs (Insulated Gate Bipolar Transistor) etc., has been being advanced. Such a power module leads to a very large amount of heat generation due to the high voltage applied to the power module. Thus, in order to improve heat dissipation, a configuration in which such a power module is mounted on a metal substrate is employed. As such a metal substrate, an aluminum alloy substrate is becoming popular because it provides an advantage of light weight and an advantage of high heat conductivity.

With such an arrangement, there is a demand for a technique for adhering a resin substrate to an aluminum substrate with high bonding strength. Thus, it has been proposed that, by forming a high-quality oxide film on an aluminum substrate for mounting a printed circuit with high precision, such an aluminum substrate for mounting a printed circuit provides improved adhesion to a resin insulating member.

SUMMARY OF THE INVENTION

The present invention has been made in view of such a situation. Accordingly, it is a general purpose of the present invention to provide a technique for providing high breakdown voltage and high heat dissipation to a component in which there is heat generation due to current that flows in its operation.

In order to solve the aforementioned problem, an embodiment of the present invention relates to a device mounting board. The device mounting board comprises: a heat dissipating substrate formed of a material containing at least one metal material selected from a group including Al, Mg, and Ti; an insulting resin layer laminated on the heat dissipating substrate; and a wiring layer laminated on the insulating resin layer, and on which a power module is to be mounted. The heat dissipating substrate comprises a random porous layer arranged such that it faces the insulating resin layer, and having cavities elongated in respective random directions.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

Detailed description will be made below with reference to the drawings regarding an embodiment configured to provide the present invention. It should be noted that, in descriptions with reference to the drawings, the same components are denoted by the same reference symbols, and redundant description will be omitted as appropriated. It should be noted that the scale and the form of each layer and each portion in the drawings are determined as is convenient for ease of description, and are by no means intended to be restricted in particular in the absence of explicit definition.

First Embodiment

Heat Dissipating Substrate

A heat dissipating substrate is formed of a material including at least one metal selected from a group including Al, Mg, and Ti. It should be noted that the heat dissipating substrate is preferably formed of aluminum from the viewpoint of heat dissipation, light weight, and costs. Description will be made below with reference to a heat dissipating substrate formed of aluminum.

Figure 1:
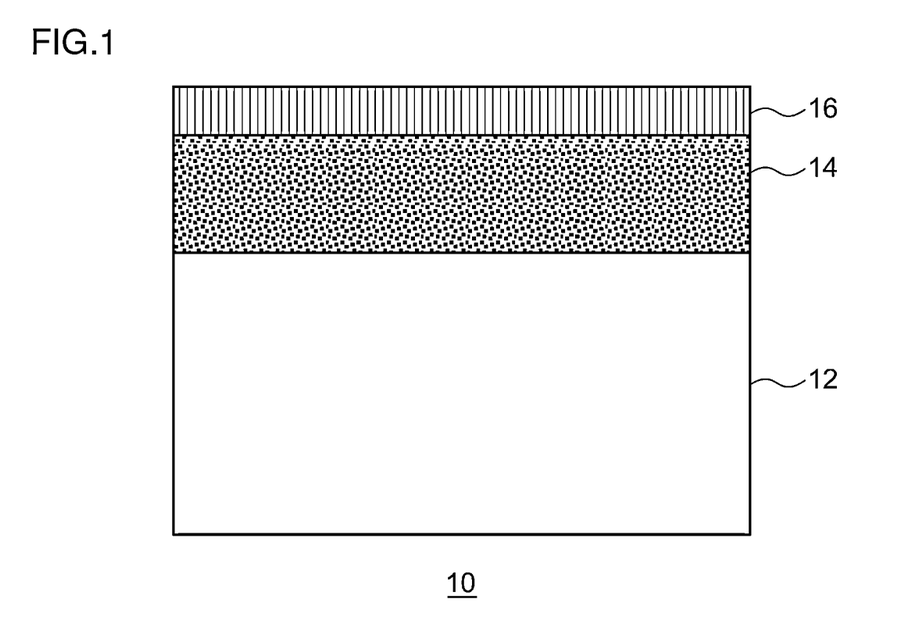
FIG. 1 is a diagram showing a schematic configuration of a heat dissipating substrate according to a first embodiment.
Figure 2:
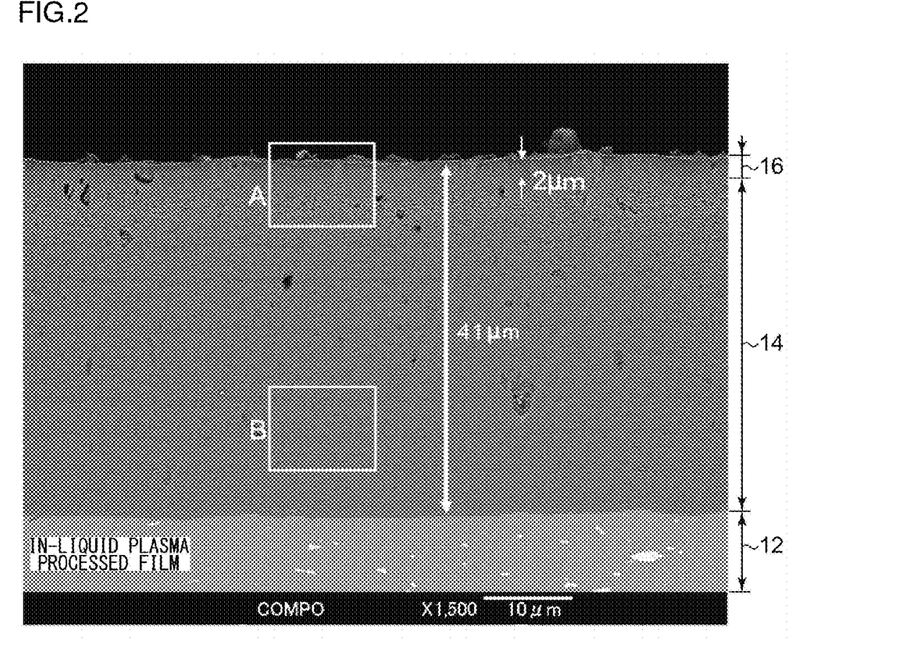
FIG. 2 shows an image of a cross-sectional face of the heat dissipating substrate acquired by means of a scanning electron microscope (SEM)
Figure 3:
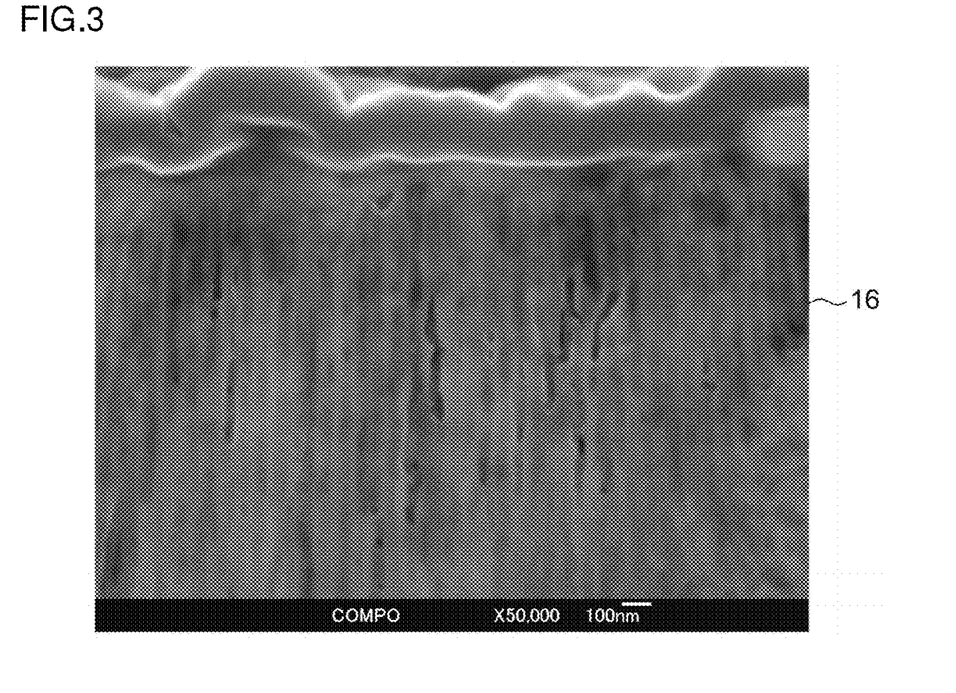
FIG. 3 is an enlarged view of the region A shown in FIG. 2.
Figure 4:
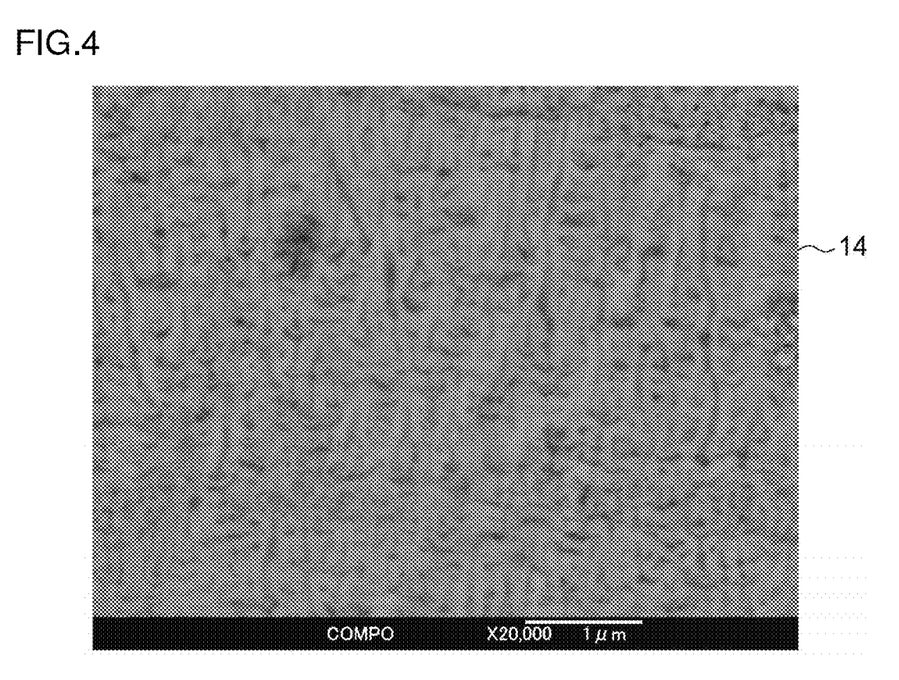
FIG. 4 is an enlarged view of the region B shown in FIG. 2.

FIG. 1 is a diagram showing a schematic configuration of a heat dissipating substrate according to a first embodiment. FIG. 2 shows an image of a cross-sectional face of the heat dissipating substrate acquired by means of a scanning electron microscope (SEM). FIG. 3 is an enlarged view of the region A shown in FIG. 2. FIG. 4 is an enlarged view of the region B shown in FIG. 2.

A heat dissipating substrate 10 includes an aluminum layer 12, a random porous layer 14 formed on the aluminum layer 12, and a longitudinal porous layer 16 formed on the random porous layer 14. The random porous layer 14 is configured as a layer having a great number of elongated capsule-shaped cavities formed within it in various random directions. Specifically, the random porous layer 14 has a mixture of elongated cavities each having a long axis that is orthogonal to the surface of the random porous layer 14 and elongated cavities each having a long axis that tilts at an angle of several degrees from the direction that is orthogonal to the surface of the random porous layer 14. With such an arrangement, almost all the elongated cavities have an axis that is orthogonal to the surface of the random porous layer 14.

It should be noted that the random porous layer 14 is configured to have a thickness on the order of 30 to 50 μm (41 μm in FIG. 2), and to have cavities having a diameter of 0.01 to 0.1 μm and a length of 0.01 to 3.0 μm, which is smaller than the thickness of the random porous layer 14. Also, the random porous layer 14 has non-linear capsule-shaped cavities (e.g., S-shaped cavities), in addition to the linear capsule-shaped cavities.

The longitudinal porous layer 16 is configured to have a thickness on the order of 1 to 3 μm (2 μm in FIG. 2), and to have a great number of approximately cylindrical micropores elongated along the direction from the surface of the heat dissipating substrate 10 toward its interior such that they do not reach the surface of the longitudinal porous layer 16 that is opposite to the surface of the heat dissipating substrate 10. The micropores are configured to have a diameter of 0.01 to 0.1 μm. With the longitudinal porous layer 16, the micropores have a depth direction that is orthogonal to the surface of the longitudinal porous layer 16.

As described above, the random porous layer 14 has elongated cavities each having a long axis that tilts at a certain angle from the direction that is orthogonal to the surface of the random porous layer 14, in addition to elongated cavities each having a long axis that is orthogonal to the surface of the random porous layer 14, such that they are distributed at random. In contrast, the longitudinal porous layer 16 has micropores having the same long axis that is orthogonal to the surface of the longitudinal porous layer 16, which is the point of difference from the random porous layer 14. The random porous layer 14 has a mixture of cavities having long axes having different angles, thereby exhibiting a breakdown voltage that is higher than that of the longitudinal porous layer 16.

[In-Liquid Plasma Processing]

Figure 5:
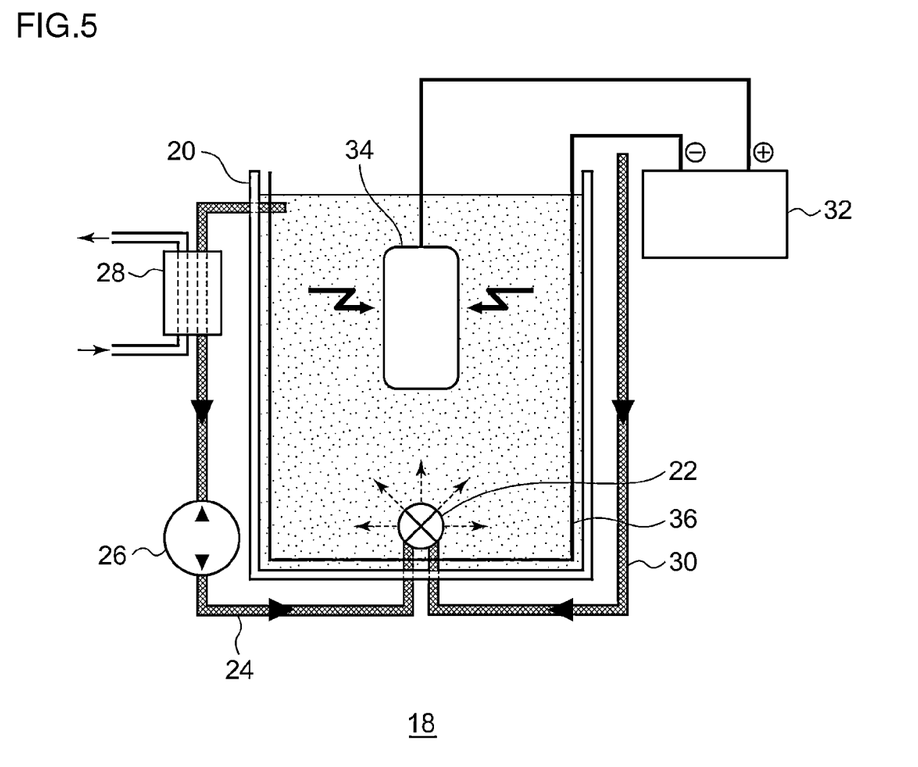
FIG. 5 is a diagram showing a schematic configuration of a processing apparatus configured to provide in-liquid plasma processing.

The random porous layer 14 and the longitudinal porous layer 16 of the heat dissipating substrate 10 can be formed by means of in-liquid plasma processing described below. FIG. 5 is a diagram of a schematic configuration of a processing apparatus configured to provide in-liquid plasma processing.

A processing apparatus 18 comprises a vessel 20, a bubble generating apparatus 22, a processing liquid circulation piping 24, a circulator 26, a heat exchanger 28, an air piping 30, and a power supply 32. The vessel 20 stores a neutral or otherwise alkaline processing liquid. The bubble generating apparatus 22 is provided to the bottom of the vessel 20, and is connected to the processing liquid circulation piping 24 and the air piping 30. With such an arrangement, the bubble generating apparatus 22 is configured to generate bubbles using air supplied via the air piping 30.

The processing liquid circulation piping 24 is arranged such that one of its ends is connected to the upper portion of the vessel 20 and the other of its ends is connected to the bottom portion of the vessel 20. By operating the circulator 26, such an arrangement is capable of supplying a processing liquid from the upper portion to the bottom portion of the vessel 20. This circulates the processing liquid within the vessel 20. The heat exchanger 28 is configured to cool the processing liquid using external cooling water.

A component 34 (Al substrate), which is to be subjected to the in-liquid plasma processing, is connected to the positive electrode of the power supply 32, whereby the component 34 functions as the anode. Moreover, the negative electrode of the power supply 32 is connected to a cathode 36 immersed in the processing liquid stored in the vessel 20. When an AC voltage is applied between the component 34 and the cathode 36 in this state, a plasma discharge (micro arc) is generated in the processing liquid. By appropriately adjusting the waveform of the AC voltage, the processing time, the kind of processing liquid, the concentration of the processing liquid, etc., the aforementioned heat dissipating substrate 10 can be formed.

Figure 6:
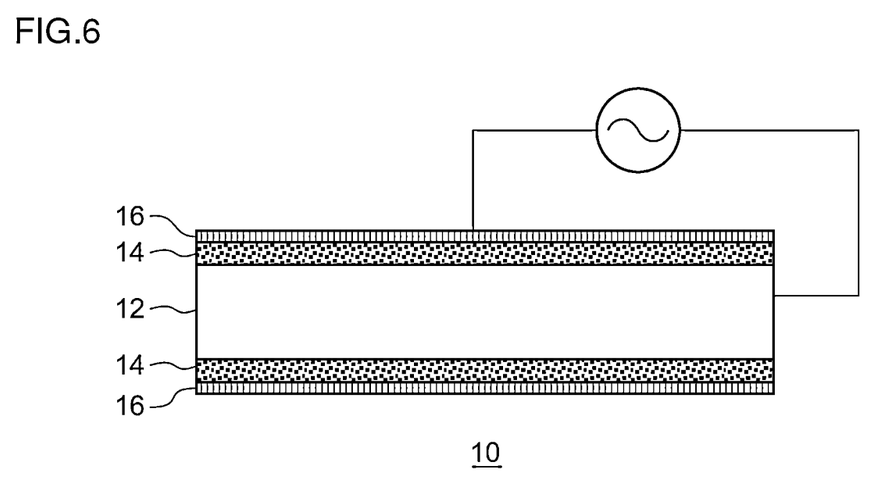
FIG. 6 is a schematic diagram showing a method for a heat dissipation substrate breakdown voltage test according to the present embodiment.

FIG. 6 is a schematic diagram showing a method for a heat dissipation substrate breakdown voltage test according to the present embodiment. The heat dissipating substrate 10 shown in FIG. 6 is configured to have a thickness of approximately 1 mm. The heat dissipating substrate 10 has a structure in which the random porous layer 14 and the longitudinal porous layer 16 are laminated on both faces of the aluminum layer 12. With such an arrangement, AC voltage was applied between the aluminum layer 12 and one of the longitudinal porous layers 16. As a result, breakdown did not occur in the heat dissipating substrate 10 according to the present embodiment even if a voltage of 3.0 kV was applied. That is to say, the heat dissipating substrate 10 according to the present embodiment exhibits a breakdown voltage that is higher than the breakdown voltage (approximately 1.0 kV) of an Al substrate having an aluminum oxide film formed using a conventional anode oxidation method (which will be simply referred to as "aluminum oxide film" hereafter).

Figure 7A:
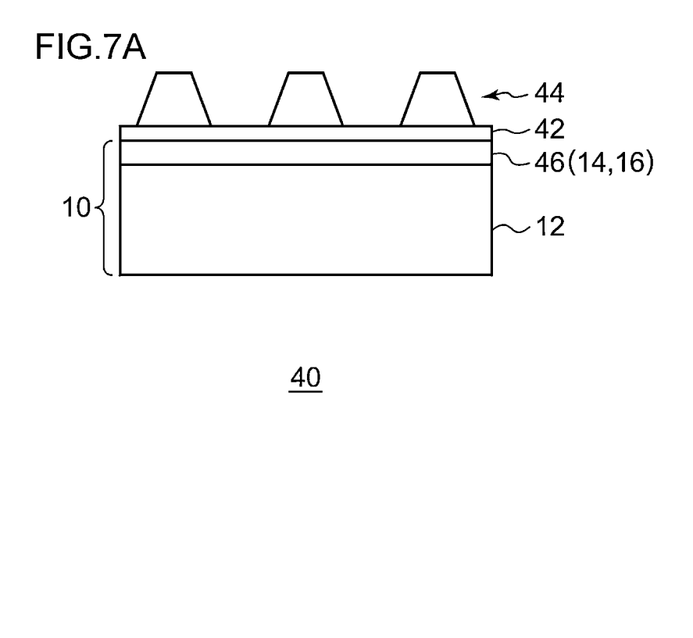
FIG. 7A is a schematic cross-sectional diagram showing a device mounting board according to the first embodiment.
Figure 7B:
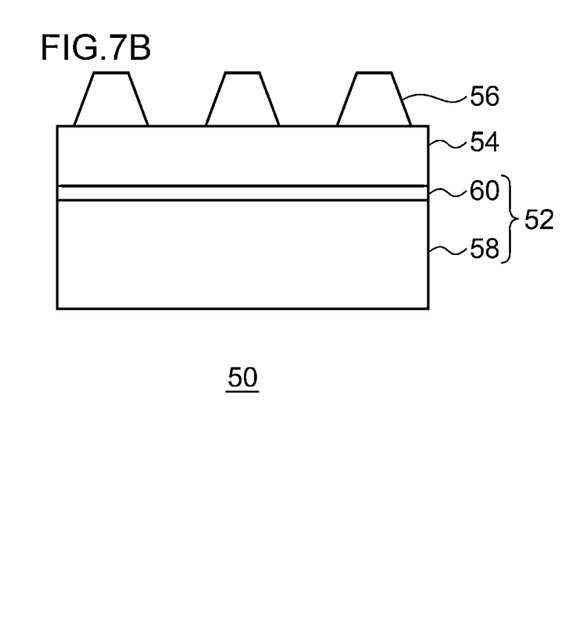
FIG. 7B is a schematic cross-sectional diagram showing a device mounting board according to a comparison example.

FIG. 7A is a schematic cross-sectional diagram showing a device mounting board according to the first embodiment, and FIG. 7B is a schematic cross-sectional diagram showing a device mounting board according to a comparison example.

A device mounting board 40 includes a heat-dissipating substrate 10, an insulating resin layer 42 laminated on the heat dissipating substrate 10, and a wiring layer 44 laminated on the insulating resin layer 42. The heat dissipating substrate 10 includes an aluminum layer 12, and a plasma-processed film 46 including at least the random porous layer 14. The random porous layer 14 is configured such that it faces the insulating resin layer 42. The wiring layer 44 is configured as copper (Cu) wiring, for example. A power module, in which there is relatively large heat generation, is mounted on the wiring layer 44, for example.

As described above, by employing the heat dissipating substrate 10, such an arrangement allows the device mounting board 40 according to the present embodiment to have improved heat dissipation. Furthermore, by means of the random porous layer 14, such an arrangement allows the heat dissipating substrate 10 to exhibit improved breakdown voltage performance. Thus, such an arrangement meets the breakdown voltage performance required for the device mounting board 40 even if the insulating resin layer 42 is configured with a small thickness. Furthermore, such an arrangement allows the thickness of the insulating resin layer 42 to be reduced, thereby providing further improved heat dissipation.

It should be noted that the heat dissipating substrate 10 may further include the longitudinal porous layer 16 formed at a position that is closer to the insulating resin layer 42 side than is the random porous layer 14. The longitudinal porous layer 16 has cylindrical micropores elongated along the direction from the surface toward the interior. Thus, for example, the micropores are filled with adhesive components of the insulating resin layer 42, thereby providing improved adhesion between the heat dissipating substrate 10 and the insulating resin layer 42.

In contrast, as shown in FIG. 7B, a device mounting board 50 according to a comparison example includes an insulating resin layer 54 laminated on a heat dissipating substrate 52, and a wiring layer 56 laminated on the insulating resin layer 54. The heat dissipating substrate 52 includes an aluminum layer 58 and an aluminum oxide film 60. Such an aluminum oxide film 60 does not have sufficient insulation breakdown voltage performance. Thus, in order to meet predetermined insulation breakdown voltage performance required for the interface between the wiring layer 56 and the aluminum layer 58, there is a need to configure the insulating resin layer 54 to have a great thickness. As a result, the device mounting board 50 according to the comparison example has poor heat dissipating performance as compared with the device mounting board 40 according to the present embodiment.

Second Embodiment

Figure 8:
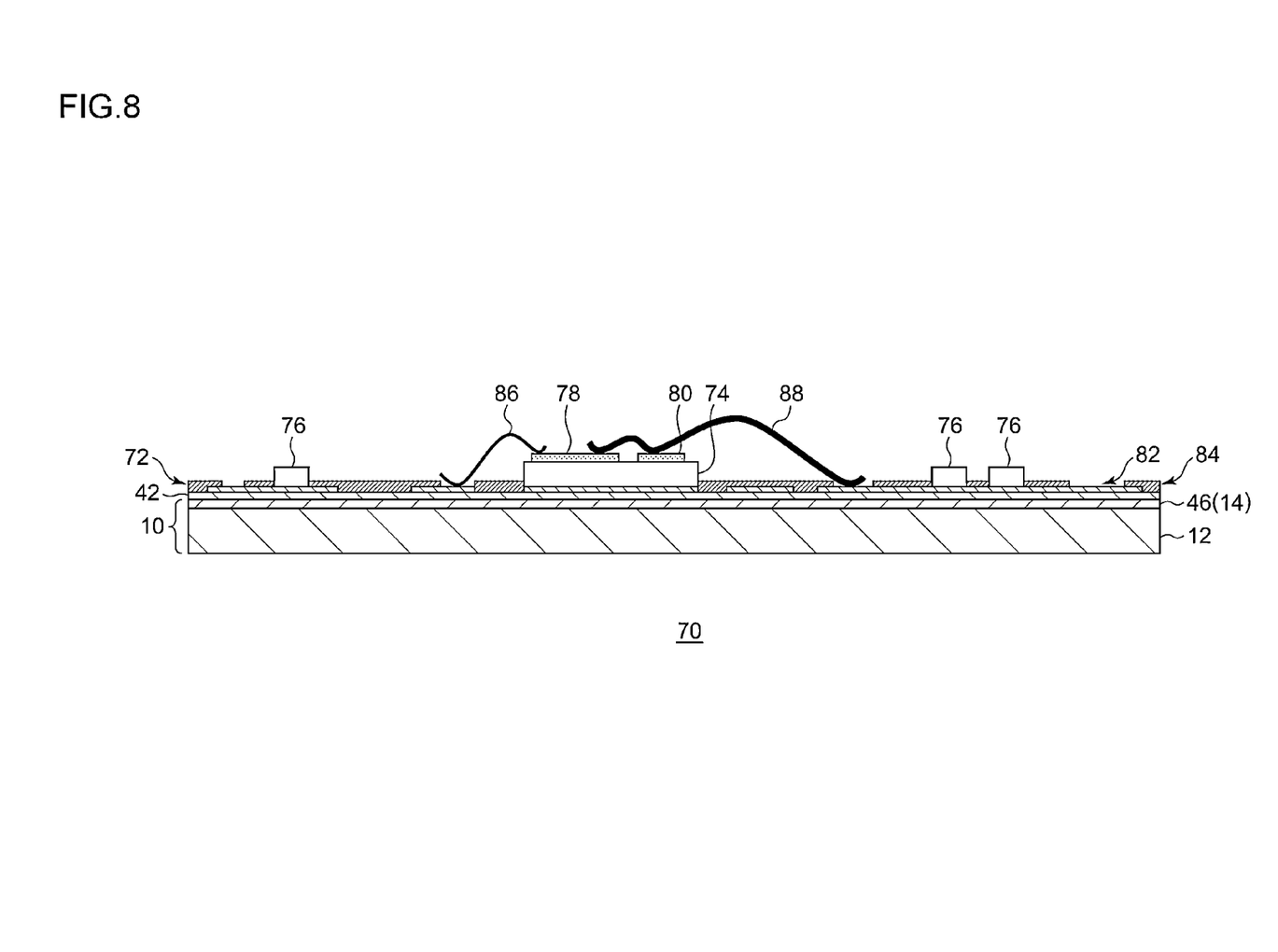
FIG. 8 is a schematic cross-sectional diagram showing a semiconductor module according to a second embodiment.

FIG. 8 is a schematic cross-sectional diagram showing a semiconductor module according to a second embodiment. As shown in FIG. 8, a semiconductor module 70 includes a heat dissipating substrate 10, an insulating resin layer 42, a wiring layer 72 on which a power module is to be mounted, a heat spreader 74, chip elements 76, an IGBT (Insulated Gate Bipolar Transistor) 78, and an FWD (Free Wheeling Diode) 80.

The heat dissipating substrate 10 comprises an aluminum layer 12 having a thickness of 1.5 mm, and a plasma-processed film 46 having a thickness of 40 μm. The plasma-processed film 46 includes at least the random porous layer 14. The insulating resin layer 42 laminated on the heat dissipating substrate 10 is configured to have a thickness of approximately 30 μm. The wiring layer 72 comprises a copper wiring layer 82 having a thickness of 70 μm, and a solder resist layer 84 having a thickness of 100 μm. Each chip element 76 is configured as a passive element such as a capacitor, a resistor, or the like, and is mounted on the copper wiring layer 82 exposed via an opening formed in the solder resist layer 84.

The IGBT 78 and the FWD 80, to which high voltage is to be applied and in which there is a large amount of heat generation, are each mounted on the wiring layer 72 via the heat spreader 74. The IGBT 78 and the FWD 80 are respectively connected to the copper wiring layer 82 via Al wires 86 and 88 having a diameter on the order of 200 to 500 μm.

As described above, by employing the heat dissipating substrate 10, such an arrangement allows the semiconductor module 70 according to the present embodiment to have improved heat dissipation. Furthermore, by means of the random porous layer 14, such an arrangement allows the heat dissipating substrate 10 to exhibit improved breakdown voltage performance. Thus, such an arrangement meets the breakdown voltage performance required for the semiconductor module 70 even if the insulating resin layer 42 is configured to have a small thickness. Furthermore, such an arrangement allows the thickness of the insulating resin layer 42 to be reduced, thereby providing further improved heat dissipation. As described above, the heat dissipating substrate 10 is preferably employed as a substrate for mounting a power module such as the IGBT 78 and the FWD 80, to which high voltage is to be applied and in which there is a large amount of heat generation.

Third Embodiment

Battery Module

Figure 9:
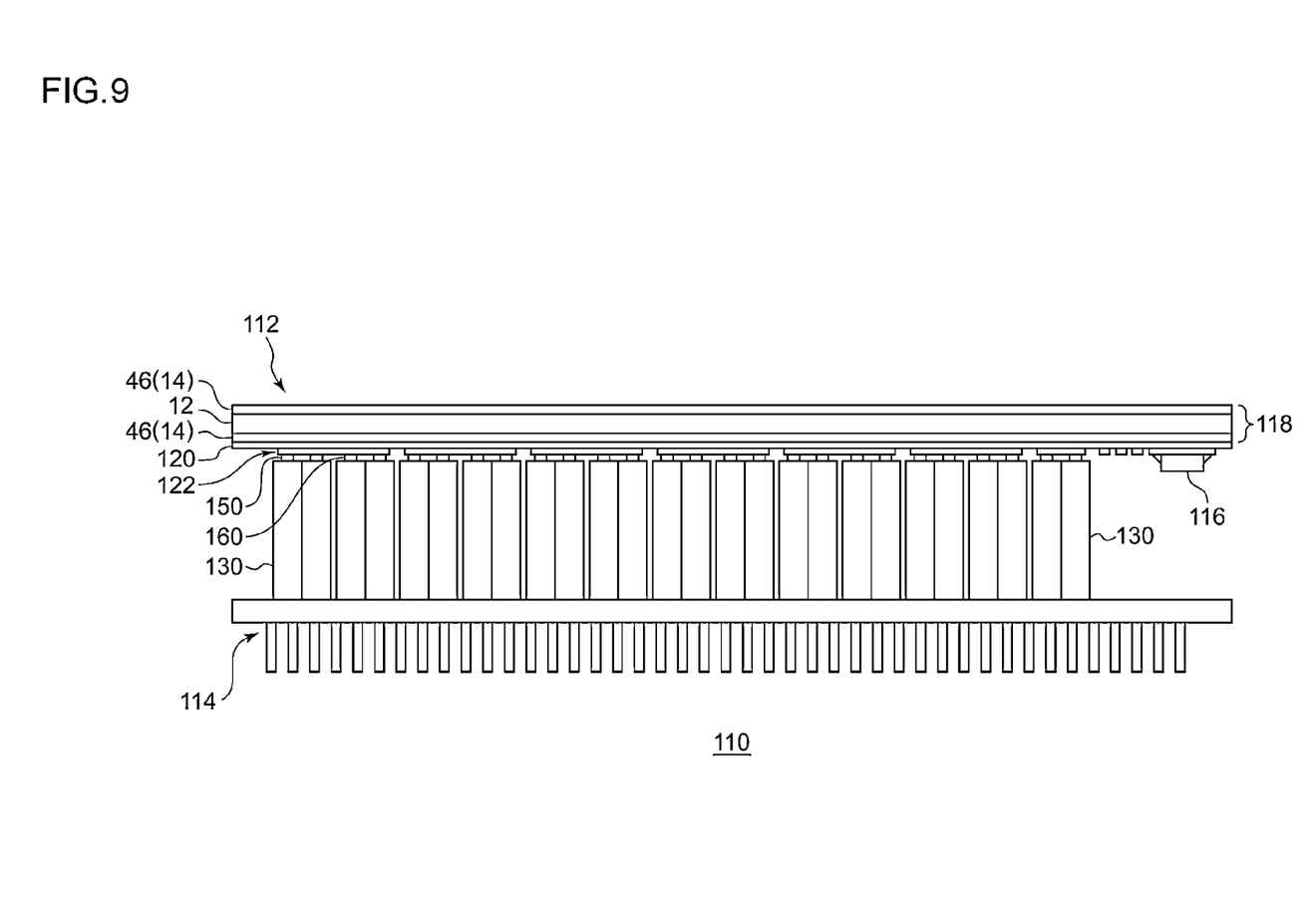
FIG. 9 is a schematic diagram showing a schematic configuration of a battery module according to a third embodiment.

FIG. 9 is a schematic diagram showing a schematic configuration of a battery module according to a third embodiment. A battery module 110 includes multiple cells (cell units) 130 arranged with intervals between them, a circuit substrate 112 configured to electrically connect the respective external terminals of the multiple cells (positive electrode terminals 150 and negative electrode terminals 160), a heat dissipating fin 114 configured to support the bottoms (lower portions) of the multiple cells 130 that are opposite to the external terminals of the cells 130, and a control IC 116 mounted on the circuit substrate 112.

[Circuit Board]

The circuit board 112 includes a heat dissipating substrate 118, an insulating resin layer 120, and a wiring layer 122. The heat dissipating substrate 118 is arranged on one of the main faces of the insulating resin layer 120. The heat dissipating substrate 118 is configured as a planar-shaped member formed of a metal such as Al, Mg, or the like, having satisfactory thermal conductivity, thereby providing the circuit board 112 with improved heat dissipation.

Examples of the material that forms the insulating resin layer 120 include melamine derivatives such as BT resin etc., liquid crystal polymer, epoxy resin, PPE resin, polyimide resin, fluorine resin, phenol resin, thermo-setting resin such as polyamide bismaleimide, etc. In order to provide improved heat dissipation of the circuit board 112, the insulating resin layer 120 is preferably configured to have high thermal conductivity. Thus, the insulating resin layer 120 is preferably configured to contain, as a filler with high thermal conductivity, silver, bismuth, copper, aluminum, magnesium, tin, zinc, or an alloy of such metal materials.

The wiring layer 122 is formed as a predetermined pattern on the other main face of the insulating resin layer 120. With the present embodiment, the wiring layer 122 is formed of copper.

The control IC 116, which is an electronic component, is mounted on the wiring layer 122. As such an electronic component, passive elements such as resistors, capacitors, etc., may be mounted on the wiring layer 122, in addition to the control IC. The control IC 116 is configured to monitor the voltage and the temperature of the cells 130, and is configured as a control circuit which controls the connection state of the cells 130. More specifically, the circuit unit is configured to monitor the voltage and the temperature of each cell 130, and has a function of detecting a cell 130 that exhibits an abnormal voltage or an abnormal temperature, and a function of disconnecting this detected cell 130 alone or otherwise disconnecting multiple cells 130 including the detected cell 130.

Furthermore, the cells 130 are connected to one main face of the circuit board 112. Specifically, the external terminals (positive electrode terminals 150 and negative electrode terminals 160) of the cells 130 are connected to the wiring layer 122 of the circuit board 112.

Figure 10:
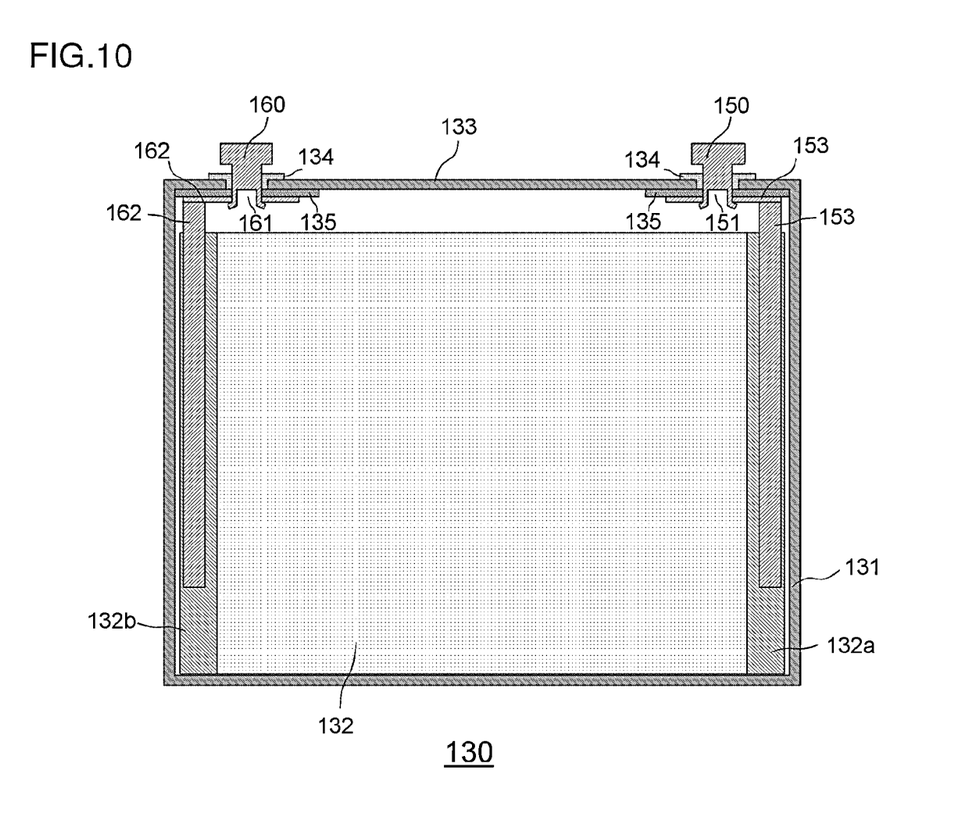
FIG. 10 is a cross-sectional diagram which shows a schematic configuration of a cell.

[Cell] FIG. 10 is a cross-sectional diagram which shows a schematic configuration of the cell 130. As shown in FIG. 10, the cell 130 has a structure in which a wound electrode body 132 having a positive electrode and a negative electrode which are wound in a spiral is housed laterally with respect to the package axis of an outer package (housing) 131, and an opening of the outer package 131 is sealed by means of sealing plates 133. Furthermore, a positive electrode terminal 150 and a negative electrode terminal 160 are respectively provided to the sealing plates 133 such that they protrude outward. Moreover, a gas discharge valve (not shown) is formed in the sealing plate 133.

The positive electrode terminal 150 is inserted into the positive electrode opening formed in the sealing plate 133 in a state in which it is in contact with a gasket 134. Furthermore, the positive electrode terminal 150 is connected to a positive electrode tab member 153 on the sealing plate 133 on the inner face side of the cell. It should be noted that a recess 151 is provided to the end of the positive electrode terminal 150 inserted into the positive electrode opening formed in the sealing plate 133, such that a side wall is formed along the positive electrode opening formed in the sealing plate 133. By swaging the positive electrode terminal 150 such that the edges of the recess 151 are extended, the positive electrode terminal 150 is fixedly mounted. The core (not shown) of the positive electrode terminal 150 is formed of aluminum, and the outer face of the core is coated with a copper plating layer (not shown). An insulating plate 135 is provided between the positive electrode tab member 153 and the sealing plate 133 on the inner face side of the cell. The insulating plate 135 and the gasket 134 are arranged such that they are in contact with each other in the positive electrode opening formed in the sealing plate 133. Such an arrangement insulates the positive electrode tab member 153 and the positive electrode terminal 150 from the sealing plate 133.

The positive electrode tab member 153 is connected to a positive electrode collecting plate set 132a that protrudes from one end of the electrode body 132. It should be noted that the positive electrode collecting plate set 132a is configured as a set of multiple bundled positive electrode collecting plates that protrude from one end of the electrode body 132.

The negative electrode terminal 160 is inserted into the negative electrode opening formed in the sealing plate 133 in a state in which it is in contact with a gasket 134. Furthermore, the negative electrode terminal 160 is connected to a negative electrode tab member 162 on the sealing plate 133 on the inner face side of the cell. It should be noted that a recess 161 is provided to the end of the negative electrode terminal 160 inserted into the negative electrode opening formed in the sealing plate 133, such that a side wall is formed along the negative electrode opening formed in the sealing plate 133. By swaging the negative electrode terminal 160 such that the edges of the recess 161 are extended, the negative electrode terminal 160 is fixedly mounted. The negative electrode terminal 160 is formed entirely of copper. An insulating plate 135 is provided between the negative electrode tab member 162 and the sealing plate 133 on the inner face side of the cell. The insulating plate 135 and the gasket 134 are arranged such that they are in contact with each other in the negative electrode opening formed in the sealing plate 133. Such an arrangement insulates the negative electrode tab member 162 and the negative electrode terminal 160 from the sealing plate 133.

The negative electrode tab member 162 is connected to a negative electrode collecting plate set 132b that protrudes from one end of the electrode body 132. It should be noted that the negative electrode collecting plate set 132b is configured as a set of multiple bundled negative electrode collecting plates that protrude from the other one end of the electrode body 132.

As described above, the cell 130 according to the present embodiment has the positive electrode terminal 150 and the negative electrode terminal 160 as the external terminals electrically connected to the electrode body 132.

With the battery module 110 shown in FIG. 9, each cell 130 is arranged between the heat dissipating substrate 118 and the heat dissipating fin 114. The heat dissipating substrate 118 has approximately the same structure as that of the dissipating substrate 10 described above, except that the plasma-processed film 46 is provided to both faces of the aluminum layer 12, instead of providing the plasma-processed film 46 to only one face of the aluminum layer 12. The heat generated by each cell 130 is dissipated via the heat dissipating substrate 118 and the heat dissipating fin 114.

As described above, the battery module 110 according to the present embodiment includes: multiple cells 130, which are arranged together and each of which includes an electrode body 132, an outer package 131 that houses the electrode body 132, external terminals (positive electrode terminal 150 and negative electrode terminal 160) arranged as external terminals of the outer package 131 and electrically connected to the electrode body 132; and a circuit board 112 configured as a connecting member which electrically connects the respective external terminals of the multiple cells 130.

The circuit board 112 includes: a heat dissipating substrate 118 formed of a material containing at least one selected from a group including Al, Mg, and Ti; an insulating resin layer 120 laminated on the heat dissipating substrate 118; and a wiring layer 122 laminated on the insulating resin layer 120 and configured to electrically connect the respective external terminals. The heat dissipating substrate 118 is arranged such that it faces the insulating resin layer 120, and includes a random porous layer 14 having cavities elongated in respective random directions.

Thus, in the same way as with the aforementioned embodiment described above, by employing the dissipating substrate 118, such an arrangement provides the battery module 110 with improved heat dissipation. Furthermore, by means of the random porous layer 14, such an arrangement provides the heat dissipating substrate 118 with improved insulation breakdown performance, thereby allowing the thickness of the insulating resin layer 120 to be reduced. As a result, such an arrangement provides further improved heat dissipation. Moreover, with the present embodiment, the plasma-processed film 46 is formed on both faces of the heat dissipating substrate 118, i.e., is also formed on the face thereof that is opposite to the insulating resin layer 120 side. As described above, the random porous layer 14 included in the plasma-processed film 46 provides improved insulation breakdown performance. Thus, there is no need to coat the outer face of the heat dissipating substrate 118 with an insulating film or the like, thereby providing further improved heat dissipation.

The heat dissipating substrate 118 may further include a longitudinal porous layer 16 formed on a side that is closer to the insulating resin layer 120 than is the random porous layer 14. Such an arrangement provides improved adhesion between the heat dissipating substrate 118 and the insulating resin layer 120 via the longitudinal porous layer 16.

It should be noted that the outer package 131 for the cells 130 may be formed of a material containing at least one metal material selected from a group including Al, Mg, and Ti. Furthermore, by forming the aforementioned random porous layer 14 on the inner face side of the outer package 131, such an arrangement provides improved insulation breakdown performance. Thus, such an arrangement allows the thickness of the insulating resin layer that coats the inner face of the outer package 131 to be reduced, or otherwise allows such an insulating resin layer to be omitted. As a result, such an arrangement provides further improved heat dissipation.

Description has been made above regarding the present invention with reference to the aforementioned embodiments. However, the present invention is by no means intended to be restricted to the aforementioned embodiments. Also, various modifications may be made by appropriately combining or replacing components of the aforementioned embodiments, which are also encompassed within the scope of the present invention. Also, various modifications may be made by modifying a combination of the embodiments, or otherwise modifying the order of the processing steps, or various designs may be modified, based on the knowledge of those skilled in this art, which are also encompassed within the scope of the present invention.

Figure 11:
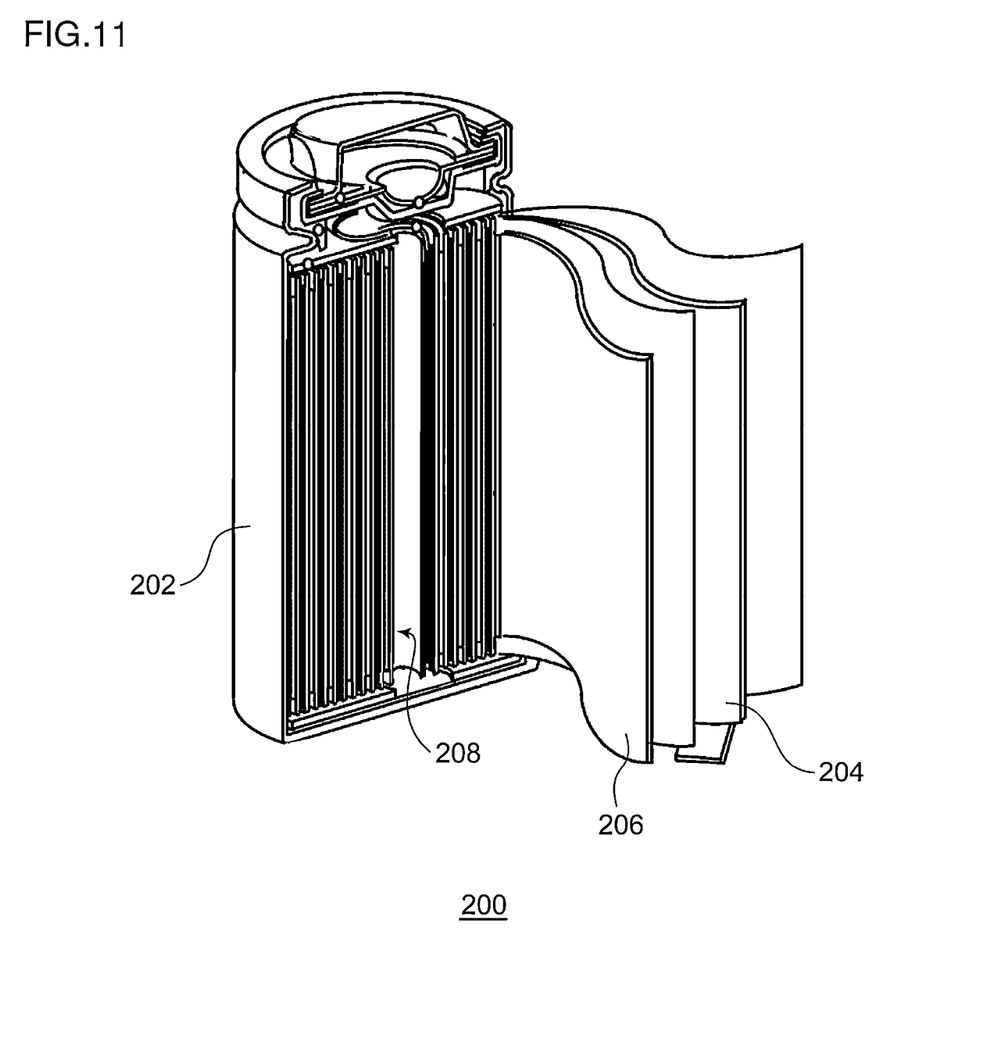
FIG. 11 is a cross-sectional diagram which shows a cell according to a modification.

FIG. 11 is a cross-sectional diagram which shows a modification of the cell. A cell 200 has a structure in which an electrode body 208 comprising a positive electrode sheet 204 and a negative electrode sheet 206 which are wound in a spiral is housed within an cylindrical outer package 202 such that the electrode body 208 is arranged in parallel with respect to the package axis of the outer package 202. Such an outer package 202 may be formed of a material containing at least one metal material selected from a group including Al, Mg, and Ti. Furthermore, by forming the aforementioned random porous layer 14 on the inner face side of the outer package 202, such an arrangement provides the cell 200 with improved insulation breakdown performance. Thus, such an arrangement allows the thickness of the insulating resin layer that coats the outer face of the outer package 202 to be reduced, or otherwise allows the insulating resin layer to be omitted. As a result, such an arrangement provides the cell 200 with further improved heat dissipation.

It should be noted that description has been made in the aforementioned embodiments regarding an example in which a device mounting board for mounting a power module, a battery module, a cell, and so forth, are each configured as a component having a problem of heat generation due to current that flows in its operation. However, components to which the present invention can be applied are not restricted to the aforementioned components. Rather, the present invention as claimed can be applied to all electric devices and all electronic components that require high insulation breakdown performance.

Various kinds of device mounting boards, cells, and battery modules, obtained by combining the arrangements listed below, are also encompassed within the scope of the present invention.

(1) A device mounting board comprising:
a heat dissipating substrate formed of a material containing at least one metal material selected from a group including Al, Mg, and Ti;
an insulting resin layer laminated on the heat dissipating substrate; and
a wiring layer laminated on the insulating resin layer, and on which a power module is to be mounted,
wherein the heat dissipating substrate comprises a random porous layer arranged such that it faces the insulating resin layer, and having cavities elongated in respective random directions.

With such an embodiment, the heat dissipating substrate provides improved heat dissipation. In addition, the random porous layer provides a function for providing the heat dissipating substrate with improved insulation breakdown performance. Thus, such an arrangement allows the insulating resin layer to be formed with a small thickness. As a result, such an arrangement provides further improved heat dissipation.

(2) A device mounting board according to (1), wherein the heat dissipating substrate further comprises a longitudinal porous layer formed on a side that is closer to the insulating resin layer side than is the random porous layer,
and wherein the longitudinal porous layer has cylindrical micropores elongated along a direction from a surface of the heat dissipating substrate toward an inner side thereof.

This provides improved adhesion between the heat dissipating substrate and the insulating resin layer via the longitudinal porous layer.

(3) A cell comprising:
an electrode body;
a housing configured to house the electrode body, and formed of a material containing at least one metal material selected from a group including Al, Mg, and Ti; and
an external terminal which is configured as an external terminal of the housing, and which is electrically connected to the electrode body
wherein the housing is configured such that a random porous layer formed on an inner face side of the housing has cavities elongated in respective random directions.

With such an embodiment, the housing provides improved heat dissipation. In addition, the random porous layer provides a function for providing the housing with improved insulation breakdown performance. Thus, such an arrangement allows the thickness of the insulating resin layer formed on the inner face of the housing to be reduced, or otherwise allows such an insulating resin layer to be omitted. As a result, such an arrangement provides further improved heat dissipation.

(4) A battery module comprising:
a plurality of cells which are arranged together, and each of which comprises an electrode body, a housing which is configured to house the electrode body, and an external terminal electrically connected to the electrode body; and
a connecting member configured to electrically connect the respective external terminals of the plurality of cells,
wherein the connecting member comprises:
a heat dissipating substrate formed of a material containing at least one metal material selected from a group including Al, Mg, and Ti;
an insulating resin layer laminated on the heat dissipating substrate; and
a wiring layer laminated on the insulating resin layer, and configured to electrically connect the respective external terminals,
and wherein the heat dissipating substrate comprises a random porous layer arranged such that it faces the insulating resin layer, and configured to have cavities elongated in respective random directions.

With such an embodiment, the heat dissipating substrate provides improved heat dissipation. In addition, the random porous layer provides a function for providing the heat dissipating substrate with improved insulation breakdown performance. Thus, such an arrangement allows the insulating resin layer to be formed with a small thickness. As a result, such an arrangement provides further improved heat dissipation.

(5) A battery module according to (4), wherein the heat dissipating substrate further comprises a longitudinal porous layer formed on a side that is closer to the insulating resin layer than is the random porous layer,
and wherein the longitudinal porous layer has cylindrical micropores elongated along a direction from a surface of the heat dissipating substrate toward its interior.

This provides improved adhesion between the heat dissipating substrate and the insulating resin layer via the longitudinal porous layer.

What is claimed is:
1. A device mounting board comprising:
a heat dissipating substrate formed of a material containing at least one metal material selected from a group including Al, Mg, and Ti;
an insulating resin layer laminated on the heat dissipating substrate; and
a wiring layer laminated on the insulating resin layer,
wherein the heat dissipating substrate comprises a first porous layer having a surface facing the insulating resin layer, and having cavities elongated in respective random directions,
the first porous layer includes a mixture of first elongated cavities and second elongated cavities, a longitudinal direction of the first elongated cavities is orthogonal to the surface of the first porous layer, a longitudinal direction of the second elongated cavities is other than a direction orthogonal to the surface of the first porous layer, the heat dissipating substrate further comprises a second porous layer formed between the first porous layer and the insulating resin layer, the second porous layer having a first surface facing the insulating resin layer and a second surface facing the first porous layer, and the second porous layer has cylindrical micropores which are elongated along a direction orthogonal to the first surface of the second porous layer toward the second surface of the second porous layer, and which do not reach the second surface of the second porous layer.

2. The device mounting board according to claim 1, wherein the first porous layer includes non-linear cavities.

3. A device mounting board comprising:

a heat dissipating substrate formed of a material containing at least one metal material selected from a group including Al, Mg, and Ti;

an insulating resin layer on the heat dissipating substrate; and a wiring layer on the insulating resin layer, wherein the heat dissipating substrate comprises a first porous layer having cavities elongated in respective random directions and having a surface facing the insulating resin layer, the first porous layer includes a mixture of first elongated cavities and second elongated cavities, a longitudinal direction of each first elongated cavity is orthogonal to the surface of the first porous layer, and a longitudinal direction of each second elongated cavity is other than a direction orthogonal to the surface of the first porous layer the heat dissipating substrate further comprises a second porous layer between the first porous layer and the insulating resin layer, the second porous layer having a first surface facing the first porous layer and a second surface facing the insulating resin layer, and the second porous layer has cylindrical micropores each of which is elongated along a direction orthogonal to the first and second surfaces of the second porous layer and does not reach the second surface of the second porous layer.

4. The device mounting board according to claim 3, wherein each cylindrical micropore is elongated only along the direction orthogonal to the first and second surfaces of the second porous layer.

5. The device mounting board according to claim 3, wherein the first porous layer includes non-linear cavities.

* * * * *